(12) United States Patent
Ortiz

(10) Patent No.: US 9,571,048 B2
(45) Date of Patent: Feb. 14, 2017

(54) DIFFERENTIAL POWER AMPLIFIER FOR MOBILE CELLULAR ENVELOPE TRACKING

(71) Applicant: RF Micro Devices, Inc., Greensboro, NC (US)

(72) Inventor: Jeffery Peter Ortiz, Chandler, AZ (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/715,181

(22) Filed: May 18, 2015

(65) Prior Publication Data

US 2016/0261242 A1 Sep. 8, 2016

Related U.S. Application Data

(60) Provisional application No. 62/129,133, filed on Mar. 6, 2015, provisional application No. 62/132,031, filed on Mar. 12, 2015, provisional application No. 62/133,529, filed on Mar. 16, 2015.

(51) Int. Cl.
| | |
|---|---|
| H03G 3/20 | (2006.01) |
| H03F 3/19 | (2006.01) |
| H03F 1/02 | (2006.01) |
| H03F 3/21 | (2006.01) |
| H03F 3/45 | (2006.01) |
| H03F 1/56 | (2006.01) |

(52) U.S. Cl.
CPC ............. *H03F 3/19* (2013.01); *H03F 1/0205* (2013.01); *H03F 1/0211* (2013.01); *H03F 1/565* (2013.01); *H03F 3/21* (2013.01); *H03F 3/45076* (2013.01); *H03F 2200/102* (2013.01); *H03F 2200/171* (2013.01); *H03F 2200/451* (2013.01); *H03F 2203/45116* (2013.01); *H03F 2203/45316* (2013.01)

(58) Field of Classification Search
CPC .... H03F 1/0222; H03F 3/191; H03F 2200/06; H03F 2200/09; H03F 2200/222; H03F 2200/387
USPC ........ 330/136, 165, 188, 195, 301, 302, 306
See application file for complete search history.

(56) References Cited

U.S. PATENT DOCUMENTS

| 7,498,876 B2* | 3/2009 | Peruzzi ................. H03F 1/0222 330/10 |
| 8,810,314 B2* | 8/2014 | Mulawski ............. H03F 1/0222 330/136 |

(Continued)

*Primary Examiner* — Steven J Mottola
(74) *Attorney, Agent, or Firm* — Withrow & Terranova, P.L.L.C.

(57) ABSTRACT

A differential power amplifier comprises an envelope tracking power supply configured to provide an envelope power supply signal to the differential power amplifier. The differential power amplifier also comprises an input stage configured to provide a differential signal having a first portion and a second portion to a differential output stage. The differential output stage comprises a first output stage amplifier configured to receive the first portion of the differential signal at a first output stage input and provide a first amplified signal at a first output stage output, as well as a second output stage amplifier configured to receive the second portion of the differential signal at a second output stage input and provide a second amplified signal at a second output stage output. The envelope power supply signal provides power for amplification.

21 Claims, 6 Drawing Sheets

(56) References Cited

U.S. PATENT DOCUMENTS

2008/0278231 A1* 11/2008 Murao ................. H03F 1/0227
  330/136
2015/0091645 A1* 4/2015 Park ..................... H03F 3/2173
  330/251

* cited by examiner

DIFFERENTIAL POWER AMPLIFIER FOR MOBILE CELLULAR ENVELOPE TRACKING

RELATED APPLICATIONS

This application claims the benefit of U.S. provisional patent application No. 62/129,133, filed Mar. 6, 2015, entitled "DIFFERENTIAL INTERSTAGE POWER LIMITER," the disclosure of which is hereby incorporated herein by reference in its entirety.

This application claims the benefit of U.S. provisional patent application No. 62/132,031, filed Mar. 12, 2015, entitled "COMPACT, HIGH PERFORMANCE, BROADBAND POWER AMPLIFIER ARCHITECTURE," the disclosure of which is hereby incorporated herein by reference in its entirety.

This application claims the benefit of U.S. provisional patent application No. 62/133,529, filed Mar. 16, 2015, entitled "DIFFERENTIAL POWER AMPLIFIER FOR MOBILE CELLULAR ENVELOPE TRACKING," the disclosure of which is hereby incorporated herein by reference in its entirety.

This application is also related to U.S. application Ser. No. 14/715,173, filed May 18, 2015, entitled "MULTI-STAGE DIFFERENTIAL POWER AMPLIFIER HAVING INTERSTAGE POWER LIMITER," the disclosure of which is hereby incorporated herein by reference in its entirety.

This application is also related to U.S. application Ser. No. 14/715,175, filed May 18, 2015, entitled "OUTPUT MATCHING NETWORK FOR DIFFERENTIAL POWER AMPLIFIER," the disclosure of which is hereby incorporated herein by reference in its entirety.

FIELD OF THE DISCLOSURE

The present disclosure relates to power amplifier circuitry, and specifically to differential power amplifiers for use in a mobile device.

BACKGROUND

The complexity of a cellular handset has increased dramatically over recent years because of increased band proliferation as the world aggressively moves to 4G (fourth generation) mobile telephone technology. The size of an RF component might be its most important feature now.

The number of supported bands in high-end smartphones now exceeds twenty (20). Most of these bands require their own duplex filter, which means the size of an RF component is one of the most (if not THE most) important feature. In most cases, RF component suppliers are competing for the same socket and are given the same footprint requirement. It is up to suppliers to determine how to budget the space they have available. If they use too much area on the power amplifier, they will need to use smaller, lower performance filters and surface mount devices (SMDs). If they choose to use premium, higher performance filters, the power amplifier area must be reduced. Thus, there remains a need to the ability to cover all of the cellular handset bands in a single power amplifier core.

The present disclosure relates to a power amplifier architecture design that covers all of the cellular handset bands from 698-915 MHz in a single power amplifier core. The disclosed power amplifier architecture is designed to simultaneously achieve broad bandwidth, high performance, compact size, and low cost with almost no compromise in any of these features. In spite of its small size and broad bandwidth, the differential power amplifier disclosed herein maintains very high performance and is extremely low in cost.

SUMMARY

A differential power amplifier is disclosed that has at least an input stage and a differential output stage. The differential power amplifier comprises an envelope tracking power supply configured to provide an envelope power supply signal to the differential power amplifier. The differential power amplifier also comprises an input stage configured to provide a differential signal having a first portion and a second portion to a differential output stage. The input stage has at least one input and at least one output. The differential output stage comprises a first output stage amplifier configured to receive the first portion of the differential signal at a first output stage input and provide a first amplified signal at a first output stage output, as well as a second output stage amplifier configured to receive the second portion of the differential signal at a second output stage input and provide a second amplified signal at a second output stage output. The envelope power supply signal provides power for amplification. In this manner, the combination of the differential power amplifier having a differential output stage and being connected to an envelope tracker provides a unique power amplifier design that has a compact size, low cost, and offers increased performance over a single-ended power amplifier design.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The complexity of a cellular handset has increased dramatically over recent years because of increased band proliferation as the world aggressively moves to 4G. The number of supported bands in high-end smartphones now exceeds twenty (20). Most of these bands require their own duplex filter, which means the size of an RF component is one of the most (if not THE most) important feature. In most cases, RF component suppliers are competing for the same socket and are given the same footprint requirement. It is up to suppliers to determine how to budget the space they have available. If they use too much area on the power amplifier, they will need to use smaller, lower performance filters and SMDs. If they choose to use premium, higher performance filters, the power amplifier area must be reduced. The present disclosure relates to a differential power amplifier architecture designed to simultaneously achieve broad bandwidth, high performance, compact size, and low cost with almost no compromise in any of these features.

A differential power amplifier is disclosed that has at least an input stage and an output stage. The input stage has at least one input and at least one output. The input stage is configured to provide a differential signal having a first portion and a second portion. The output stage may comprise a first output stage amplifier and a second output stage amplifier. The first output stage amplifier is configured to receive the first portion of the differential signal at a first output stage input and provide a first amplified signal at a first output stage output. The second output stage amplifier is configured to receive the second portion of the differential signal at a second output stage input and provide a second amplified signal at a second output stage output. The differential power amplifier is also connected to an envelope tracker. The envelope tracker may be coupled to an output of the input stage, prior to the differential signal being provided to the first and second output stage inputs of the output stage amplifiers. In this manner, the combination of the differential power amplifier having a differential output stage and being connected to an envelope tracker provides a unique power amplifier design that has a compact size, low cost, and offers increased performance over a single-ended differential power amplifier design.

One of the main attributes of the disclosed differential power amplifier is that it uses a differential output stage, which gives it several advantages over a single-ended output stage. In addition, when the differential output stage is used with an envelope tracker, it is unique and has better performance than a single-ended power amplifier design.

Figure 1:
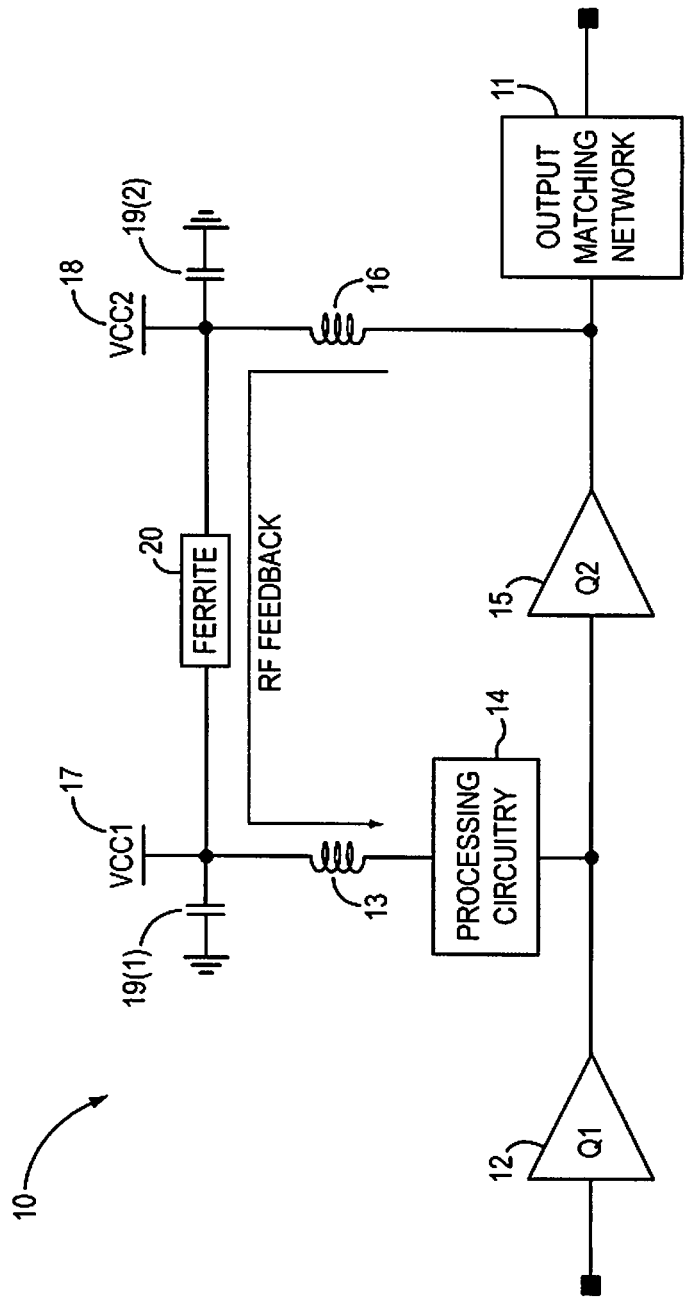
FIG. 1 shows a generic power amplifier with a single-ended output stage.

FIG. 1 shows a generic power amplifier with a single-ended output stage. A power amplifier 10 may be connected via its output to an output matching network 11. The power amplifier 10 in FIG. 1 has a first stage amplifier 12 and a second stage amplifier 15, each of which has a single input and a single output, making it a single-ended output. An inductor 13 and other processing circuitry 14 may be coupled to the output of the first stage amplifier 12. An inductor 16 may be coupled to the output of the second stage amplifier 15. Voltage supplies VCC1 17 and VCC2 18, coupled to capacitors 19(1) and 19(2), respectively, provide power to the power amplifier 10. This single-ended output stage design is vulnerable to RF feedback to the input stage, especially when tied to an envelope tracker, due to the fact that the envelope tracker can drive a limited amount of bypass capacitance.

Typically, a ferrite, such as ferrite 20 in FIG. 1, is required to help isolate the first and second stages of the power amplifier 10. However, the ferrite 20 has its own disadvantages. For example, the ferrite 20 causes spectral regrowth because of its "memory effect."

To address the RF feedback without having to use a ferrite, a differential multistage power amplifier having a differential output stage and connected to an envelope tracker is disclosed.

Figure 2:
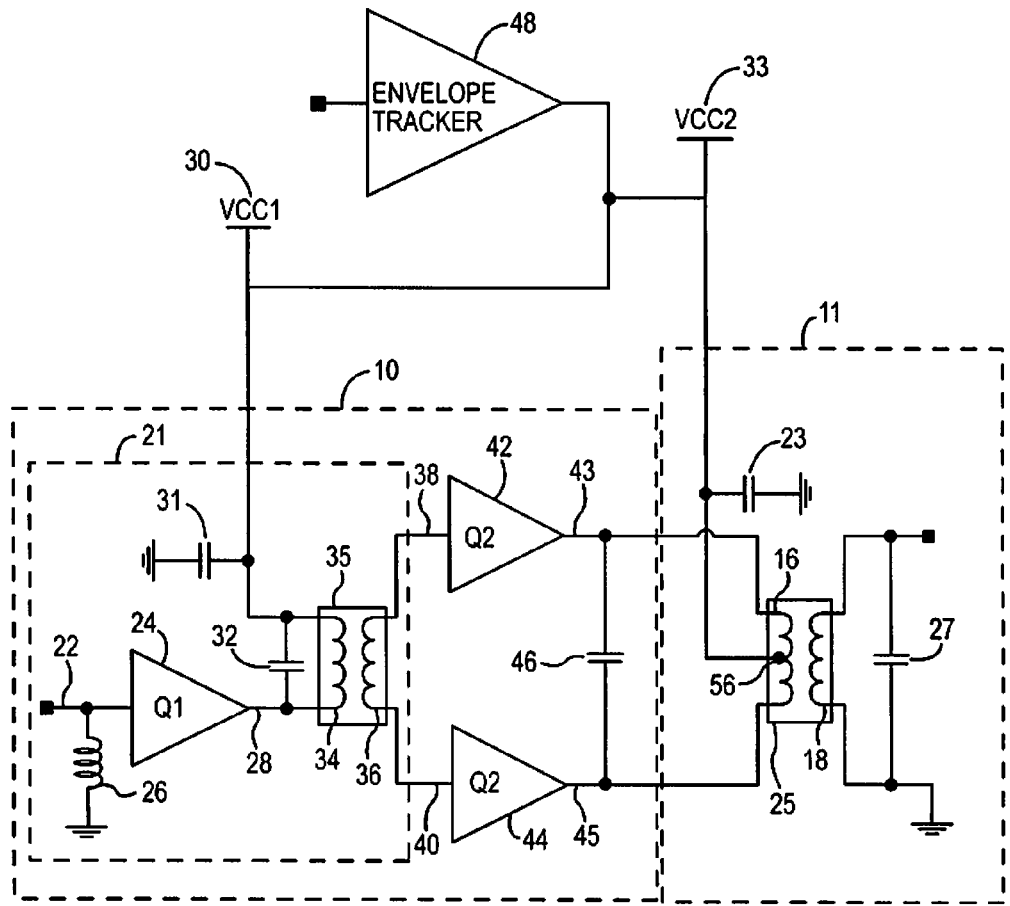
FIG. 2 is a schematic of a differential multistage power amplifier having a differential output stage, a connected envelope tracker, and an output matching network, according to one exemplary embodiment.

FIG. 2 is a schematic of a differential multistage power amplifier having a differential output stage, a connected envelope tracker, and an output matching network, according to one exemplary embodiment. The differential power amplifier 10 is shown having multiple stages. The design shown in FIG. 2 has a differential output stage represented by output stage amplifiers 42 and 44. The differential power amplifier 10 is also coupled to an output matching network 11, which is discussed more fully in U.S. application Ser. No. 14/715,175, filed May 18, 2015, entitled "Output Matching Network For Differential Power Amplifier." The output matching network 11 comprises a power supply voltage VCC2 33 connected to capacitance 14 and an output transformer 25 consisting of a pair of windings 16 and 18, which are coupled to a capacitance 27. The output transformer 25 has a center tap 56. This output matching network 11 is very small, high performance, and broadband.

The differential power amplifier 10 includes an input stage 21, indicated by the dashed line. The portion of the differential power amplifier 10 outside the dotted line may be referred to as the output stage. A first stage input 22 is fed into an input stage amplifier 24 that is grounded via inductor 26. The differential power amplifier 10 also comprises power supply voltage VCC1 30. The input stage output 28 is coupled via capacitance 32 and a transformer 35 consisting of windings 34 and 36 to first and second output stage inputs 38 and 40 of a plurality of output stage amplifiers 42 and 44, respectively. In this manner, the input stage amplifier 24 has an input stage output 28, which provides a differential signal having a first portion and a second portion to the first and second output stage inputs 38 and 40 of a plurality of output stage amplifiers 42 and 44, respectively. The first output stage amplifier 42 has a first output stage output 43. The second output stage amplifier 44 has a second output stage output 45. The first and second output stage outputs 43 and 45 of the first and second output stage amplifiers 42 and 44 are coupled to capacitance 46 and to the output transformer 25 of the output matching network 11.

An envelope tracker 48 is coupled to the differential power amplifier 10. The envelope tracker 48 is configured to provide an envelope power supply signal to the differential power amplifier 10. In particular, an output of the envelope tracker 48 may be coupled to an output of the input stage amplifier 24, prior to the differential signal being provided to the first and second output stage inputs 38 and 40 of the first and second output stage amplifiers 42 and 44, respectively. The envelope power supply signal provided by the envelope tracker 48 provides power for amplification. A capacitance 31 may also be coupled to the envelope tracker 48 in one embodiment. In one embodiment, the capacitance 31 may be forty-five picoFarads (45 pF). The combination of the differential power amplifier 10 having a differential output stage and being connected to an envelope tracker 48 provides a unique power amplifier design that has a compact size, low cost, and offers increased performance over a single-ended power amplifier design.

Many of the advantages of a differential power amplifier over a single-ended design are well known (e.g., better power supply rejection, improved grounding, and even-order harmonic rejection). A less obvious advantage is that a differential architecture has more bandwidth because the output load line is approximately four (~4) times higher than a single-ended design, which reduces the impedance transformation ratio of the output matching network. A lower transformation ratio results in higher bandwidth.

Another advantage of a differential power amplifier with a differential output stage is feedback stability. This is particularly a benefit when a power amplifier, such as differential power amplifier 10 in FIG. 2, is tied to an envelope tracker, such as envelope tracker 48 in FIG. 2. The envelope tracker 48 can drive a limited amount of bypass capacitance. This causes a single-ended output stage design to be vulnerable to RF feedback to the input stage, as discussed above with respect to FIG. 1. Typically, a ferrite, such as ferrite 20 in FIG. 1, is required to help isolate the input and output stages of the power amplifier. However, this ferrite 20 causes spectral regrowth because of its "memory effect." A differential output stage, as shown in FIG. 2, dramatically reduces the RF feedback.

Figure 3:
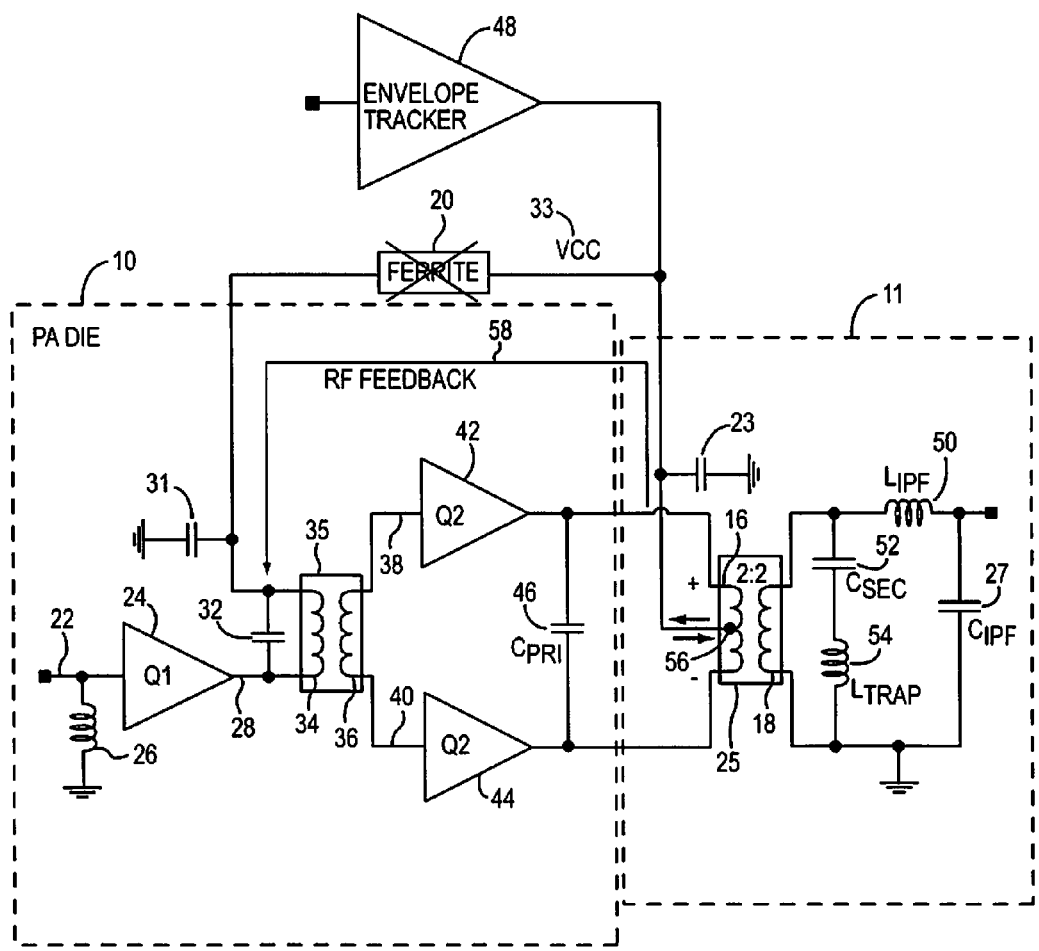
FIG. 3 is a schematic of a differential multistage power amplifier having a differential output stage, a connected envelope tracker, and an alternate output matching network, without a ferrite, according to another exemplary embodiment.

This can be seen further in FIG. 3. FIG. 3 is a schematic of a differential multistage power amplifier having a differential output stage, a connected envelope tracker, and an alternate output matching network, without a ferrite, according to another exemplary embodiment. The differential power amplifier 10 in FIG. 3 is similar to the one in FIG. 2. A first stage input 22 is fed into an input stage amplifier 24 that is grounded via inductor 26. A common collector power supply VCC 33 provides power to the differential power amplifier 10 and to the output matching network 11. The input stage output 28 is coupled via capacitance 32 and a transformer 35 consisting of windings 34 and 36 to first and second output stage inputs 38 and 40 of a plurality of output stage amplifiers 42 and 44, respectively. In this manner, the input stage amplifier 24 has an input stage output 28, which provides a differential signal having a first portion and a second portion to the first and second output stage inputs 38 and 40 of a plurality of output stage amplifiers 42 and 44, respectively. The first output stage amplifier 42 has a first output stage output 43. The second output stage amplifier 44 has a second output stage output 45. The first and second output stage outputs 43 and 45 of the first and second output stage amplifiers 42 and 44 are coupled to on-chip capacitor 46 and to the output transformer 25 of the output matching network 11.

The output matching network 11 in FIG. 3 is an alternate output matching network as compared to the one in FIG. 2. The output matching network 11 receives power from the common voltage supply VCC 33. A capacitor 23 may be coupled to the common voltage supply VCC 33 in one embodiment. In one embodiment, the capacitor 23 may have a capacitance of thirty-three picofarads (33 pF). The output matching network 11 in FIG. 3 may comprise a output transformer 25 consisting of a pair of windings 16 and 18, cascaded with a low-pass filter (comprising inductor 50 and capacitor 27). The output transformer 25 is configured to receive a first amplified signal from the first output stage output 43 of the first differential output stage amplifier 42 of the differential power amplifier 10 and provide a first output signal to the cascaded low pass filter. The output transformer 25 is configured to receive a second amplified signal from the second output stage output 45 of the second differential output stage amplifier 44 of the differential power amplifier 10 and provide a second output signal to the cascaded low pass filter.

The output transformer 25 may be a laminate transformer in one embodiment. In other embodiments, the output transformer 25 may be implemented on a die. The output transformer 25 has a center tap 56. In addition, as seen in FIG. 3, a parasitic second harmonic trap comprising a capacitor 52 and a trap inductor 54 may also be formed in the first leg of the filter for enhanced second harmonic rejection. Higher order harmonics are sufficiently rejected with the low pass filter comprising $L_{lpf}$ inductor 50 and and $C_{lpf}$ capacitor 27. Harmonic rejection is critical for carrier aggregation support and for emissions into the global satellite positioning bands. This output matching network of FIG. 3 has remarkable bandwidth, insertion loss, size, and harmonic rejection.

A differential output stage, such as shown in FIG. 3, dramatically reduces the RF feedback 58 because of the cancellation at the center tap 56 of the output transformer 25, as shown in FIG. 3. The ferrite 20 is therefore no longer needed, which eliminates its memory effect and results in improved performance. The differential output stage reduces the RF feedback 58 to the voltage supply in the differential power amplifier 10, which allows both stages of the differential power amplifier 10 to operate with the envelope tracker 48. As mentioned above, the differential output stage also increases the loadline by approximately four times, which improves the RF bandwidth. This increased loadline also improves the output return loss, which reduces ripple into the filters, which improves the envelope tracker linearity. For example, in one embodiment, the optimal load line for the power amplifier design may be approximately seventeen (~17) ohms. Better bandwidth and harmonic rejection may be achieved if all of the impedance transformation is done in the low-pass filter, though this is not necessary. This means the output transformer 25 may need a 1:1 turns ratio. However, a turns ratio of 2:2 can be achieved by stacking the turns vertically in the laminate for a laminate transformer. This reduces the size of the transformer dramatically (because the mutual inductance increases with the square of the turns). In one embodiment, the die and laminate output matching network section is approximately 1.5 mm×2.5 mm (including the bypass capacitors).

In one embodiment, the output transformer 25 may be a 2:2 transformer, as indicated in FIG. 3, with approximately two turns on the primary winding and approximately two turns on the secondary winding. However, in other embodiments, the turns ratio may vary between approximately two and approximately three turns on the primary winding and between approximately one and a half turns and approximately three turns on the secondary winding. In one embodiment, the output transformer 25 may be a 2:1.5 transformer, with approximately two turns on the primary winding and approximately one and a half turns on the secondary winding.

Figure 4:
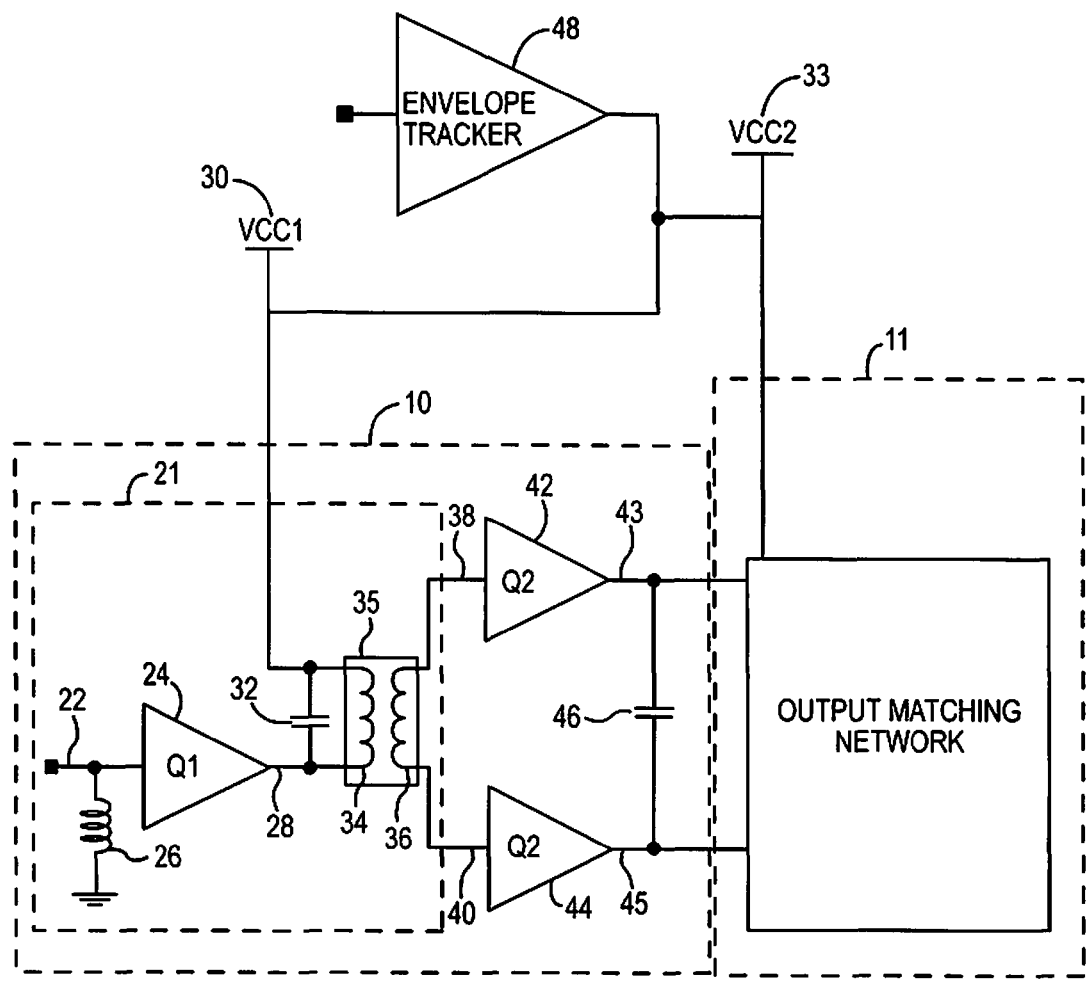
FIG. 4 is a schematic of a differential multistage power amplifier having a differential output stage, a connected envelope tracker, and a generic output matching network, according to another exemplary embodiment.

In addition, the on-chip capacitor 46 on the die of the differential power amplifier 10 also improves the efficiency of the envelope tracker 48. The on-chip capacitor 46 creates short, at odd harmonics, resulting in inverse Class F power amplifier operation, which improves envelope tracker 48 efficiency. Thus, the differential power amplifier 10 with the differential output stage when used in connection with an envelope tracker 48, provides many advantages over a single-ended output stage. This design may be used with any generic output matching network, as shown in FIG. 4. FIG. 4 is a schematic of a differential multistage power amplifier having a differential output stage, a connected envelope tracker, and a generic output matching network, according to another exemplary embodiment. FIG. 4 is similar to FIGS. 2 and 3, but the output matching network 11 is generic. This indicates that the differential power amplifier 10 with the differential output stage when used in connection with an envelope tracker 48, is itself a unique design and one that provides many advantages over a single-ended output stage. Or, in the alternative, the differential power amplifier 10 with the differential output stage can be combined with either of the high performance output matching networks shown in FIGS. 2 and 3.

Figure 5:
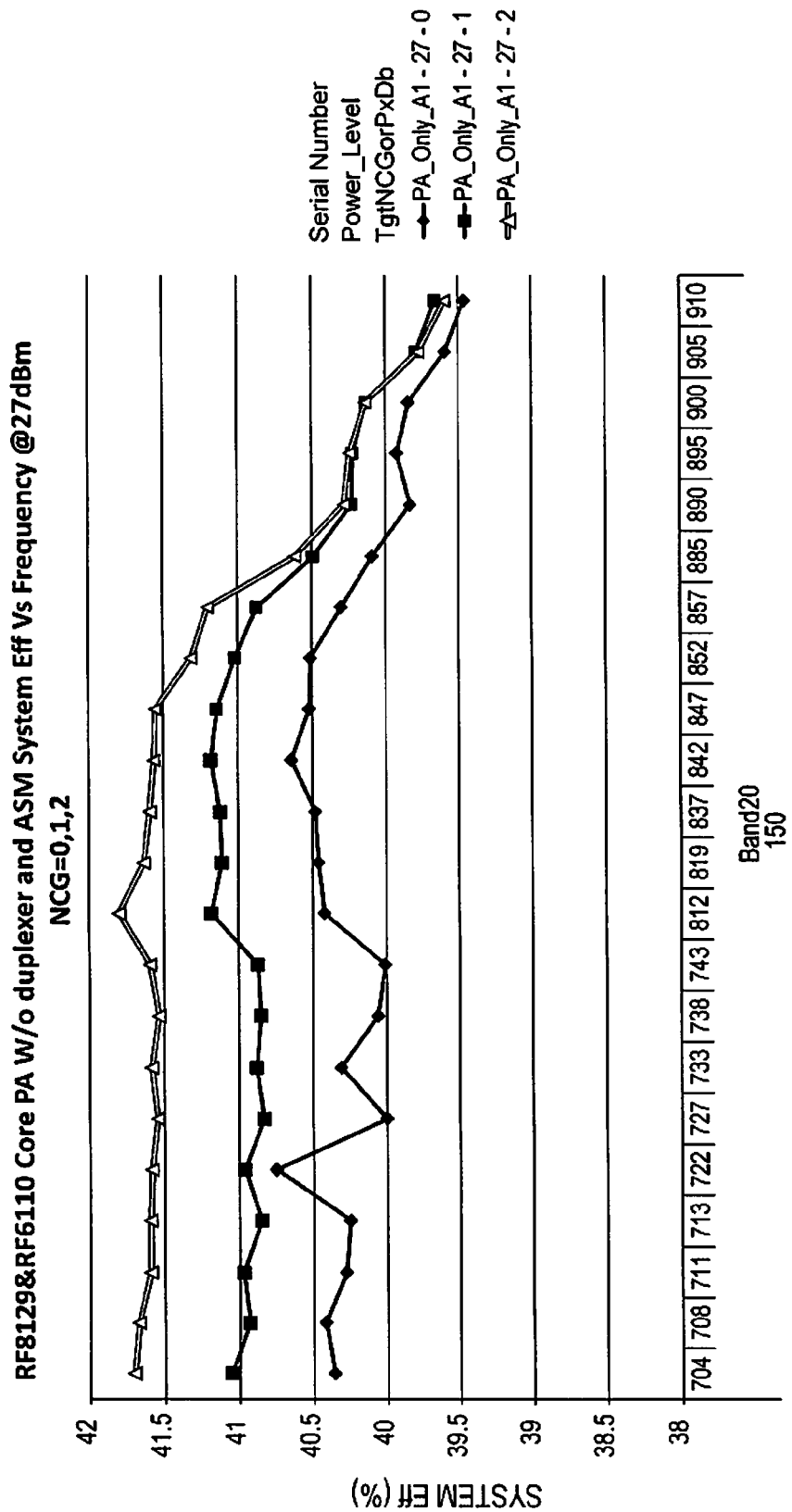
FIG. 5 is a graph that shows the system efficiency of a differential multistage power amplifier having a differential output stage and including a Tx band switch and an envelope tracker.

The total system efficiency of the differential power amplifier, a Tx band switch, and the envelope tracker are shown in FIG. 5 with LTE modulation. FIG. 5 is a graph that shows the system efficiency of a differential multistage power amplifier having a differential output stage and including a Tx band switch and an envelope tracker. The insertion loss of the TX band switch is ~0.4 dB. This level of efficiency is considered very good for any power amplifier architecture of any size.

Figure 6:
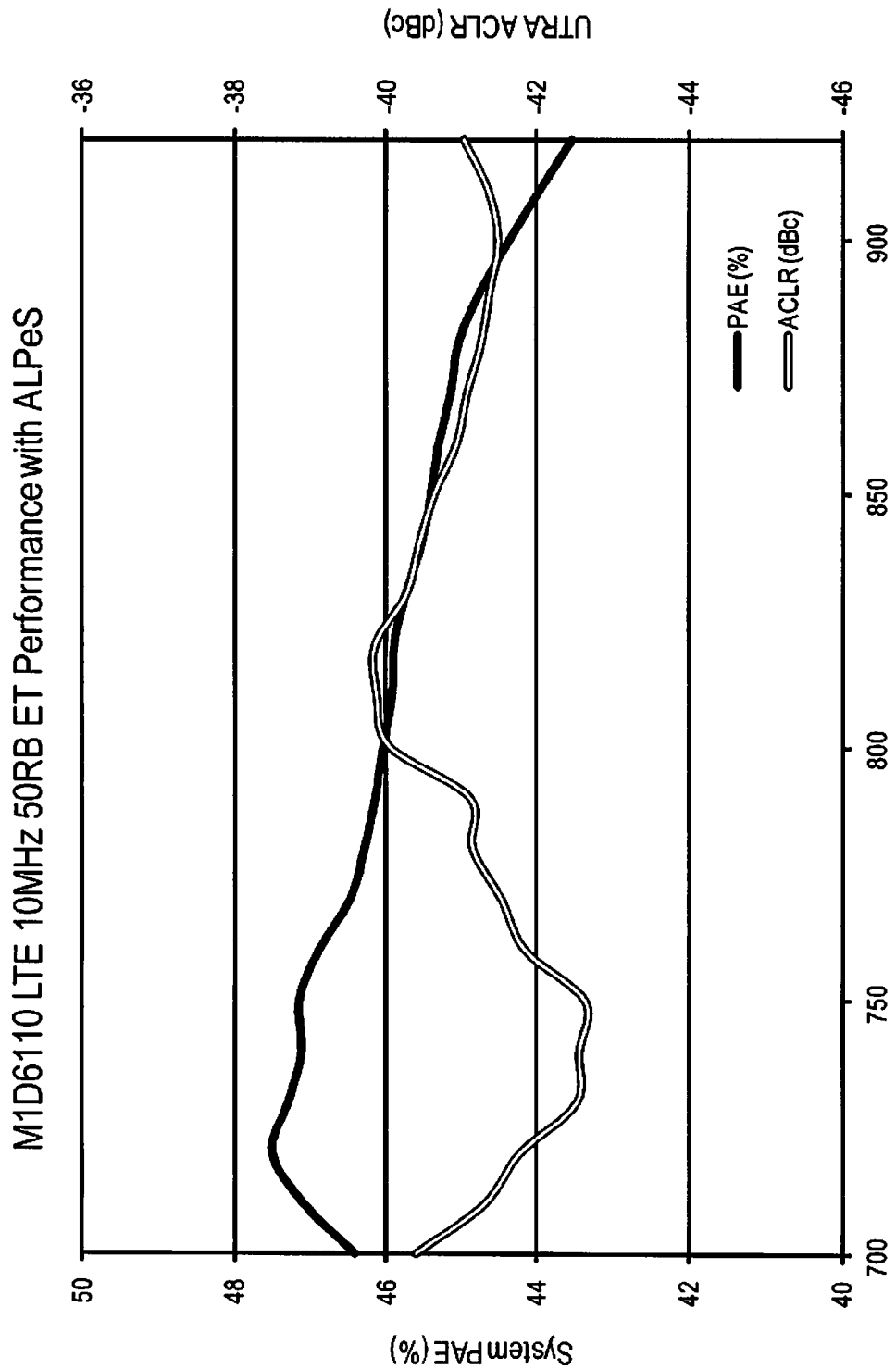
FIG. 6 is a graph that shows the system efficiency of a differential multistage power amplifier having a differential output stage and an envelope tracker without the Tx band switch loss.

FIG. 6 is a graph that shows the system efficiency of a differential multistage power amplifier having a differential output stage and an envelope tracker without the Tx band switch loss. Once again, the efficiency of the differential multistage power amplifier with the differential output stage is at a level that is considered to be very good.

Those skilled in the art will recognize improvements and modifications to the present disclosure. All such improvements and modifications are considered within the scope of the concepts disclosed herein.

What is claimed is:

1. A differential power amplifier comprising:
an envelope tracking power supply configured to provide an envelope power supply signal to the differential power amplifier;
an input stage having at least one input and at least one output, the input stage configured to provide a differential signal having a first portion and a second portion, wherein the input stage comprises a transformer;
a first output stage amplifier configured to receive the first portion of the differential signal at a first output stage input and provide a first amplified signal at a first output stage output;
a second output stage amplifier configured to receive the second portion of the differential signal at a second output stage input and provide a second amplified signal at a second output stage output; and
a first capacitance coupled to the envelope tracking power supply and to the at least one output of the input stage, wherein the envelope power supply signal provides power for amplification.

2. The differential power amplifier of claim 1, wherein the input stage comprises input stage circuitry including an amplifier.

3. The differential power amplifier of claim 1, wherein the input stage comprises a plurality of amplifiers.

4. The differential power amplifier of claim 1, further comprising at least one additional stage comprising a plurality of amplifiers between the input stage and the first and second output stage amplifiers.

5. The differential power amplifier of claim 1, wherein the transformer comprises a pair of windings.

6. The differential power amplifier of claim 1, further comprising a second capacitance coupled to the first output stage output of the first output stage amplifier and to the second output stage output of the second output stage amplifier.

7. The differential power amplifier of claim 6, wherein the second capacitance is configured to create short, at odd harmonics.

8. The differential power amplifier of claim 1, further comprising an output matching network coupled to the first and second output stage outputs and configured to receive the first and second amplified signals.

9. The differential power amplifier of claim 8, wherein the output matching network comprises a low pass filter and an output transformer having a center tap.

10. The differential power amplifier of claim 9, wherein the low pass filter comprises an inductor and a capacitor.

11. The differential power amplifier of claim 9, wherein the low pass filter is configured to filter out higher order harmonics of the first and second amplified signals.

12. The differential power amplifier of claim 9, wherein the first output stage amplifier and the second output stage amplifier are configured to reduce RF feedback to the differential power amplifier due to cancellation at the center tap of the output transformer.

13. The differential power amplifier of claim 10, wherein the output matching network further comprises a parasitic second harmonic trap comprising a capacitor and a trap inductor, wherein the parasitic second harmonic trap is configured to provide rejection of second harmonics.

14. The differential power amplifier of claim 9, wherein the output transformer comprises a primary winding and a secondary winding, with between approximately two and approximately three turns on the primary winding and between approximately one and a half turns and approximately three turns on the secondary winding.

15. The differential power amplifier of claim 9, wherein the output transformer has approximately two turns on the primary winding and approximately two turns on the secondary winding.

16. The differential power amplifier of claim 9, wherein the output transformer has approximately two turns on the primary winding and approximately one and a half turns on the secondary winding.

17. A differential power amplifier comprising:
an envelope tracking power supply configured to provide an envelope power supply signal to the differential power amplifier;
an input stage having at least one input and at least one output, the input stage configured to provide a differential signal having a first portion and a second portion;
a first output stage amplifier configured to receive the first portion of the differential signal at a first output stage input and provide a first amplified signal at a first output stage output;
a second output stage amplifier configured to receive the second portion of the differential signal at a second output stage input and provide a second amplified signal at a second output stage output; and
an output matching network coupled to the first and second output stage outputs and configured to receive the first and second amplified signals,
wherein the output matching network comprises a low pass filter and an output transformer having a center tap, and
wherein the envelope power supply signal provides power for amplification.

18. The differential power amplifier of claim 17, wherein the low pass filter comprises an inductor and a capacitor.

19. The differential power amplifier of claim 17, wherein the low pass filter is configured to filter out higher order harmonics of the first and second amplified signals.

20. The differential power amplifier of claim 17, wherein the first output stage amplifier and the second output stage amplifier are configured to reduce RF feedback to the differential power amplifier due to cancellation at the center tap of the output transformer.

21. The differential power amplifier of claim 20, wherein the output matching network further comprises a parasitic second harmonic trap comprising a capacitor and a trap inductor, wherein the parasitic second harmonic trap is configured to provide rejection of second harmonics.

* * * * *